United States Patent [19]

Mochizuki et al.

[11] Patent Number: 5,548,559
[45] Date of Patent: Aug. 20, 1996

[54] SEMICONDUCTOR INTEGRATED CIRCUIT

[75] Inventors: Yoshio Mochizuki; Hideo Kato, both of Kawasaki; Nobutake Sugiura, Yokohama, all of Japan

[73] Assignee: Kabushiki Kaisha Toshiba, Tokyo, Japan

[21] Appl. No.: 448,852

[22] Filed: May 24, 1995

[30] Foreign Application Priority Data

May 25, 1994 [JP] Japan .................................. 6-111156

[51] Int. Cl.$^6$ .................................................. G11C 8/00
[52] U.S. Cl. .............................. 365/230.08; 365/230.03; 365/236
[58] Field of Search ...................... 365/230.03, 230.08, 365/238

[56] References Cited

U.S. PATENT DOCUMENTS

| | | | |
|---|---|---|---|
| 4,670,748 | 6/1987 | Williams ........................ | 365/230.08 X |
| 4,800,535 | 1/1989 | McAlpine ....................... | 365/230.03 |
| 5,016,226 | 5/1991 | Hiwada et al. .................. | 365/230.03 |
| 5,303,201 | 4/1994 | Sakamoto ....................... | 365/236 |
| 5,307,319 | 4/1994 | Kohketsu et al. ................ | 365/230.03 |
| 5,430,859 | 7/1995 | Norman et al. .................. | 395/425 |

*Primary Examiner*—David C. Nelms
*Assistant Examiner*—Son Dinh
*Attorney, Agent, or Firm*—Loeb & Loeb LLP

[57] ABSTRACT

A semiconductor integrated circuit includes a chip address data designation circuit, which has nonvolatile circuit characteristics or nonvolatilely programmed wiring corresponding to a chip address assigned to each of semiconductor chips connected to common buses, to output first chip address data corresponding to the chip address upon receiving an operation power supply voltage. The semiconductor integrated circuit further includes a chip address data latch circuit for latching second chip address data supplied from outside to the semiconductor chip, and a chip selection control circuit for comparing the first chip address data and the second chip address data, and generating a chip selection signal for activating the semiconductor chip when the first chip address data and the second chip address data coincide with each other. The chip address assigned to each semiconductor chip can be stored nonvolatilely, and one of the chips can be selected in response to the chip address supplied from outside the chip.

6 Claims, 5 Drawing Sheets

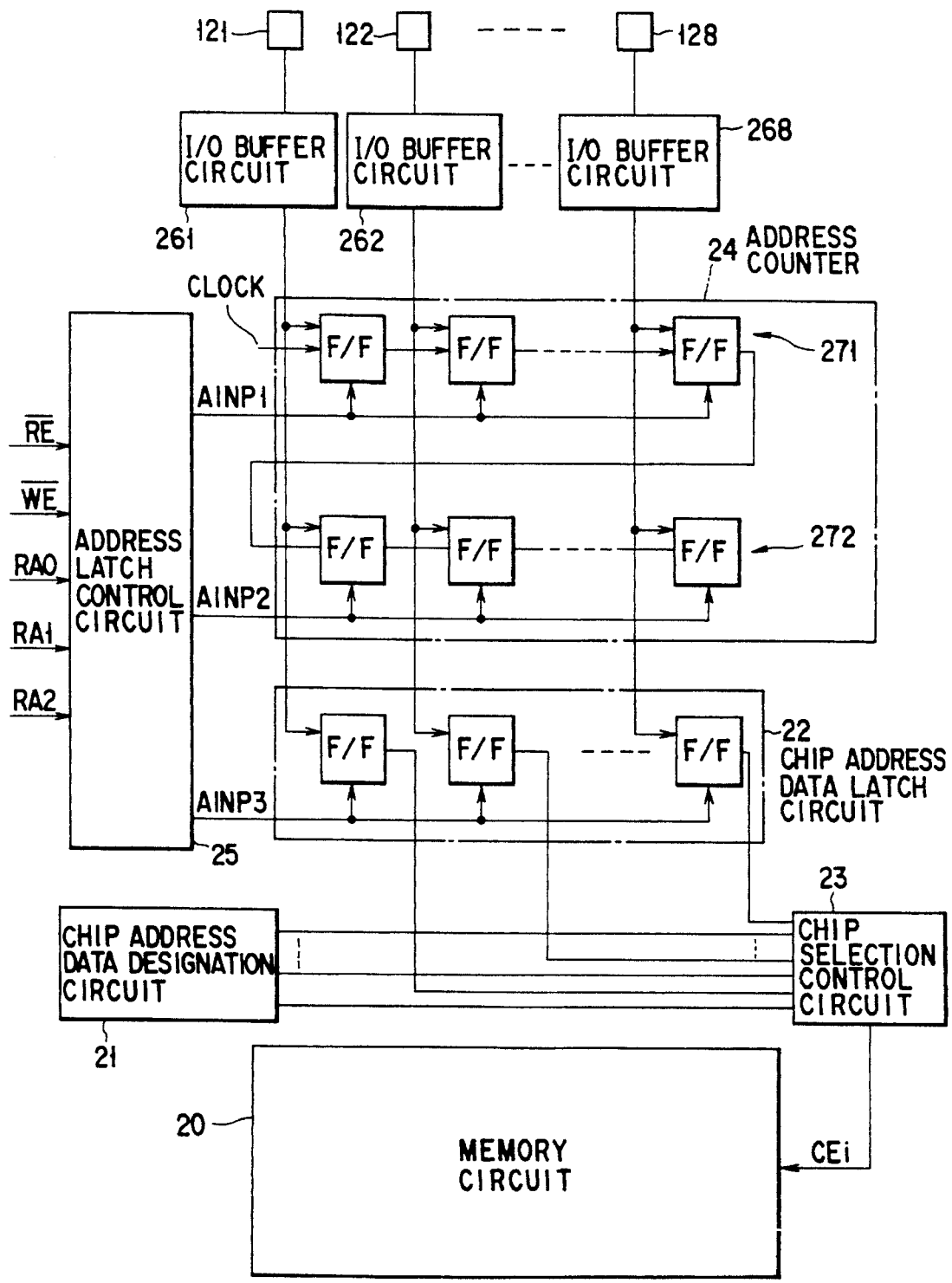
F I G. 2

SEMICONDUCTOR INTEGRATED CIRCUIT

BACKGROUND OF THE INVENTION

1. Field of the Invention

The present invention relates to an integrated circuit (IC) such as a semiconductor memory and, more specifically, to a chip address storing section of an integrated circuit for selecting a semiconductor chip when an address assigned in advance to the chip coincides with a chip address supplied from outside the chip.

2. Description of the Related Art

A conventional data processing system, such as a microcomputer using a plurality of semiconductor memories, has the circuit arrangement as shown in FIG. 7 or 8 in order to select one of a plurality of memory chips.

The microcomputer system shown in FIG. 7 includes, for example, 4-bit input/output (I/O) buses 70 serving as both a data bus and an address bus, a plurality of memory chips 711 to 715 each having 4-bit I/O terminals, control input terminals supplied with a reading control read enable signal $\overline{RE}$, a writing control write enable signal $\overline{WE}$, and register selecting address signals RA0 to RA2, and a chip selection terminal supplied with a corresponding one of chip selecting chip enable signals $\overline{CE1}$ to $\overline{CE5}$ and chip selecting signal lines 701 to 705 through which the chip enable signals $\overline{CE1}$ to $\overline{CE5}$ are supplied to the respective memory chips 711 to 715.

The microcomputer system shown in FIG. 8 differs from that shown in FIG. 7 in that memory chips 811 to 815 each have three chip address setting terminals S0 to S2 externally supplied with (power supply or ground) potentials for assigning, e.g., 3-bit chip addresses, and the chip selection terminals thereof are supplied with the same chip enable signal $\overline{CE}$. The memory chips 811 to 815 are selected when the addresses assigned to the chips by combination of the potentials supplied to the chip address setting terminals S0 to S2, coincide with chip addresses supplied from outside the chips.

However, the microcomputer system shown in FIG. 7 requires the chip selecting signal lines 701 to 705 the number of which is equal to that of the memory chips. The more the memory chips, the larger the occupied area of the memory chips mounted on a printed circuit board in the microcomputer system. In the system shown in FIG. 8, the memory chips 811 to 815 need the plural chip address setting terminals S0 to S2, the number of pads on each chip increases, as does the area of the chip, thus increasing in chip cost.

As described above, the conventional microcomputer system requires a plurality of chip selecting signal lines the number of which is equal to that of chips or a plurality of chip address setting terminals for assigning chip addresses to semiconductor chips. Thus, it has a problem in which the area of chips occupied in the system increases and so does the cost of the chips.

SUMMARY OF THE INVENTION

The present invention has been developed in order to resolve the above problem. An object of the invention is to provide a semiconductor integrated circuit which requires neither chip selecting signal lines corresponding in number to semiconductor chips nor chip address setting terminals for assigning chip addresses to semiconductor chips. Another object of the present invention is to provide a semiconductor integrated circuit capable of nonvolatilely storing chip address data to simply assign chip addresses to their corresponding semiconductor chips connected to common buses, and selecting one of the semiconductor chips in response to a chip address supplied from outside the chip.

According to one aspect of the present invention, there is provided a semiconductor integrated circuit comprising:

- a chip address data designation circuit having one of nonvolatile circuit characteristic and nonvolatilely programmed wiring corresponding to a chip address assigned to a semiconductor chip, for outputting first chip address data corresponding to the chip address upon receiving an operation power supply voltage;
- a chip address data latch circuit for latching second chip address data supplied from outside the semiconductor chip; and
- a chip selection control circuit for comparing the first chip address data and the second chip address data, and generating a chip selection signal for activating the semiconductor chip when the first chip address data and the second chip address data coincide with each other.

According to another aspect of the present invention, there is provided a semiconductor integrated circuit comprising:

- a chip address data designation circuit having one of nonvolatile circuit characteristic and nonvolatilely programmed wiring corresponding to a chip address assigned to a semiconductor chip, for outputting first chip address data corresponding to the chip address upon receiving an operation power supply voltage;
- a chip selection control circuit for comparing the first chip address data with second chip address data supplied from outside the semiconductor chip, and generating a chip selection signal for activating the semiconductor chip when the first chip address data and the second chip address data coincide with each other; and
- a chip selection signal latch circuit for latching the chip selection signal generated from the chip selection control circuit.

Since chip address data corresponding to a chip address assigned to each of semiconductor chips connected to their common buses is stored nonvolatilely, one of the chips can be selected in response to the chip address data supplied from outside the chip. Neither chip selecting signal lines corresponding in number to the semiconductor chips nor chip address setting terminals for assigning chip addresses to the semiconductor chips, are needed; therefore, the area of chips occupied in a microcomputer system does not increase, nor does the cost of the chips.

Since, furthermore, chip address data can be designated in the same step as that of wire patterning MOS transistors of memory cells or implantating ions into channel regions of the MOS transistors of the memory cells for designating data of the memory cells, the number of PEP (photo engraving processes) is not made larger than that in the conventional manufacturing process of mask ROM chips.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 2 is a block diagram showing one of the mask ROM chips of FIG. 1;

DETAILED DESCRIPTION OF THE PREFERRED EMBODIMENTS

Embodiments of the present invention will now be described in detail with reference to the accompanying drawings.

Figure 1:
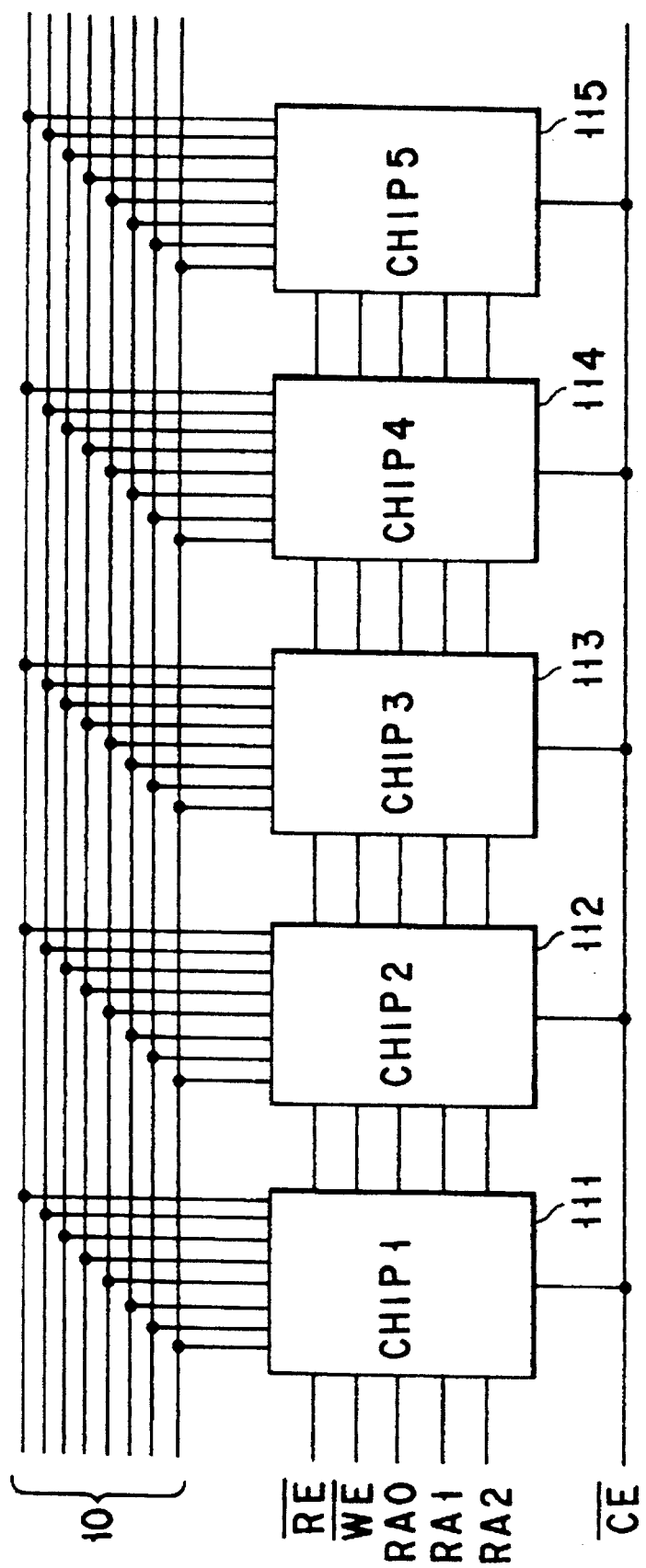
FIG. 1 is a block diagram showing a microcomputer system using a plurality of mask ROM chips according to a first embodiment of the present invention.

FIG. 1 is a block diagram showing a microcomputer system using a plurality of mask ROM chips according to a first embodiment of the present invention, and FIG. 2 is a block diagram showing one of the mask ROM chips of FIG. 1.

The microcomputer system illustrated in FIG. 1 includes, for example, 8-bit input/output (I/O) buses serving as both a data bus and an address bus, and a plurality of memory chips 111 to 115 each having eight I/O terminals (121 to 128 in FIG. 2), control input terminals supplied with a reading control read enable signal $\overline{RE}$, a writing control write enable signal $\overline{WE}$, and register selecting address signals RA0 to RA2, and a single chip selection terminal supplied with a chip selecting chip enable signal $\overline{CE}$.

As shown in FIG. 2, each of the memory chips 111 to 115 also has a memory circuit 20, a chip address designation circuit 21, a chip address data latch circuit 22, a chip selection control circuit 23, an address counter circuit 24, and an address latch control circuit 25.

The memory circuit 20 includes a memory cell array having a plurality of memory cells constituted of MOS transistors in which data is designated by implanting ions into channel regions. The chip address data designation circuit 21 has a nonvolatile circuit characteristic or nonvolatilely programmed wiring which corresponds to a chip address assigned to the memory chip, and outputs chip address data when it is supplied with an operation power supply voltage.

The chip address data latch circuit 22, which includes eight D-type flip-fop circuits F/F, latches 8-bit chip address data which is supplied from the I/O buses 10 through the I/O terminals 121 to 128 and I/O buffer circuits 261 to 268.

The chip selection control circuit 23 includes an 8-bit coincidence circuit for comparing chip address data output from the chip address data designation circuit 21 and chip address data latched by the chip address data latch circuit 22 and for, when they coincide with each other, generating a chip selection signal CEi for activating the memory chip.

The address counter circuit 24 includes two cascade-connected address data latch circuits 271 and 272 (each having eight D-type flip-flop circuits F/F) each for latching 8-bit memory cell address data which is supplied from the I/O buses 10 through the I/O terminals 121 to 128 and I/O buffer circuits 261 to 268. These circuits 271 and 272 are intended for increment of values counted in response to clock pulse signals supplied from inside the memory chip.

The address latch control circuit 25 decodes chip selection address signals RA0 to RA2 input from outside the memory chip, and generates latch pulse signals AINP1 and AINP2 for the address data latch circuits 271 and 272 of the address counter circuit 24 and latch pulse signal AINP3 for the chip address data latch circuit 22.

Figure 3:
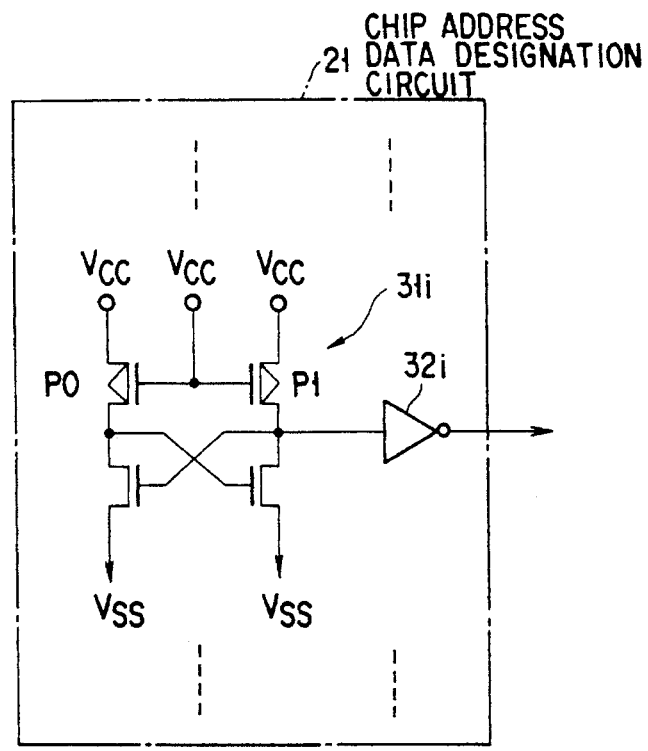
FIG. 3 is a circuit diagram showing an example of a chip address data designation circuit of FIG. 2.

FIG. 3 shows an example of the chip address data designation circuit 21 in FIG. 2. The circuit connection shown in FIG. 3 is only for one bit, for simplicity of illustration. However, the circuit 21 indeed includes circuits the number of which corresponds to that of bits of the chip address data (8 bits in the embodiment shown in FIG. 2). The circuit connection for one bit shown in FIG. 3 includes a flip-flop circuit 31$i$ ($i$=1 to 8) having a nonvolatile circuit characteristic corresponding to the memory chip and an inverter circuit 32$i$ ($i$=1 to 8) for inverting an output signal of the flip-flop circuit 31$i$. A threshold value is determined by implanting ions into a channel region of either PMOS load transistor P0 or P1 of the flip-flop circuit 31$i$ in the same step as that of implanting the ions into the channel regions of the MOS transistors of the memory cells for designating data of the memory cells. The flip-flop circuit 31$i$ outputs data "0" or "1" when receiving an operation power supply voltage, according to which PMOS load transistor P0 or P1 ions are implanted into. Since the above two ion-implantations are performed in the same step, the number of steps can be decreased. However, they need not be always done in the same step.

Figure 4:
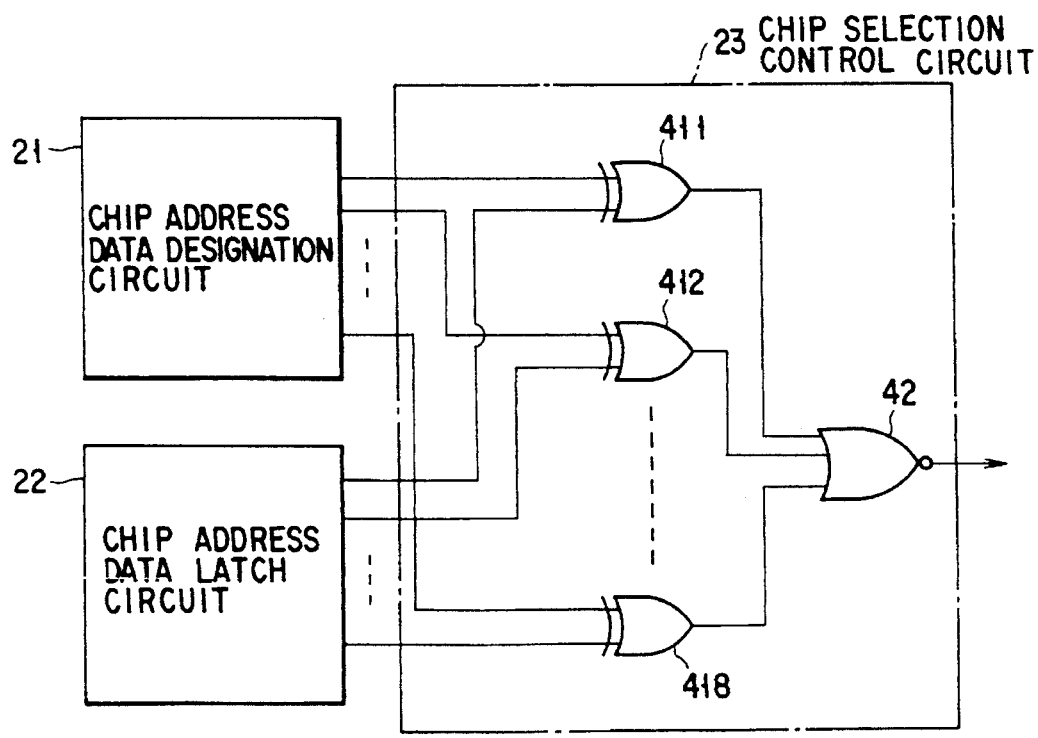
FIG. 4 is a circuit diagram showing an example of a chip selection control circuit of FIG. 2.

FIG. 4 is a circuit diagram showing an example of the chip selection control circuit 23 in FIG. 2.

Referring to FIG. 4, the circuit 23 includes eight exclusive-OR gates 411 to 418 each supplied with corresponding two of chip address data output from the chip address data designation circuit 21 and chip address data latched by the chip address data latch circuit 22, and a NOR gate 42 supplied with a signal output from each of the exclusive-OR gates.

In a certain memory chip of the microcomputer system shown in FIG. 1, if the chip address data output from the chip address data designation circuit 21 and that output from the chip address data latch circuit 22 coincide with each other when a chip enable signal $\overline{CE}$ is active, the chip selection control circuit 23 outputs an active chip selection signal CEi, thus selecting the memory chip.

Since the mask ROM memory chips 111 to 115 of the first embodiment nonvolatilely stores chip address data assigned thereto, one of the memory chips can be selected in response to a chip address supplied from outside the chip. Thus, neither chip selection signal lines the number of which is equal to that of the memory chips nor chip address setting terminals for assigning chip addresses to their respective memory chips are needed, with the result that the area of chips occupied in the microcomputer system or the cost of the chips is hardly increased. Furthermore, chip address data can be programmed in the process of implanting ions into channel regions of MOS transistors of memory cells for programming data of the memory cells, and the number of PEP (photo engraving processes) is not larger than that in the conventional manufacturing process of mask ROM chips.

Figure 5:
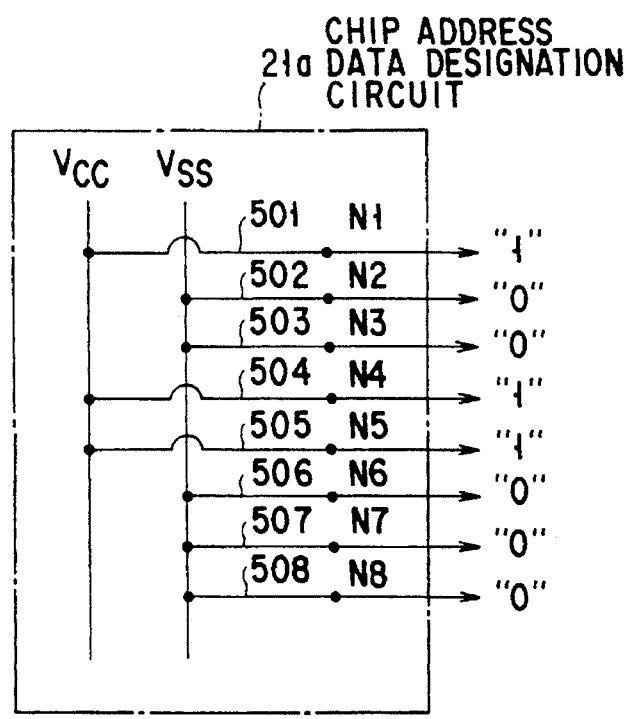
FIG. 5 is a circuit diagram showing another example of a chip address data designation circuit of FIG. 2.

FIG. 5 is a circuit diagram of a chip address data designation circuit 21a which is another example of the circuit 21 shown in FIG. 3. Referring to FIG. 5, the circuit 21a comprises a plurality of nodes N1 to N8 the number of which is the same as that of bits of chip address data (eight bits in the embodiment of FIG. 2) and lines 501 to 508 formed between the nodes N1 to N8 and the nodes of power supply potentials (Vcc) or ground potentials (Vss) in accordance with a chip address assigned to a memory chip including the circuit 21a. In other words, the nodes N1 to N8 are selectively connected to the power supply nodes or ground nodes by wirings of, for example, aluminum and output data "1" or "0" when they are supplied with an operation power supply voltage.

According to the chip address data designation circuit 21a described above, chip address data can be designated in the same step as that of wire patterning the memory cells, and the number of PEP is not made larger than that in the conventional manufacturing process of mask ROM chips.

Figure 6:
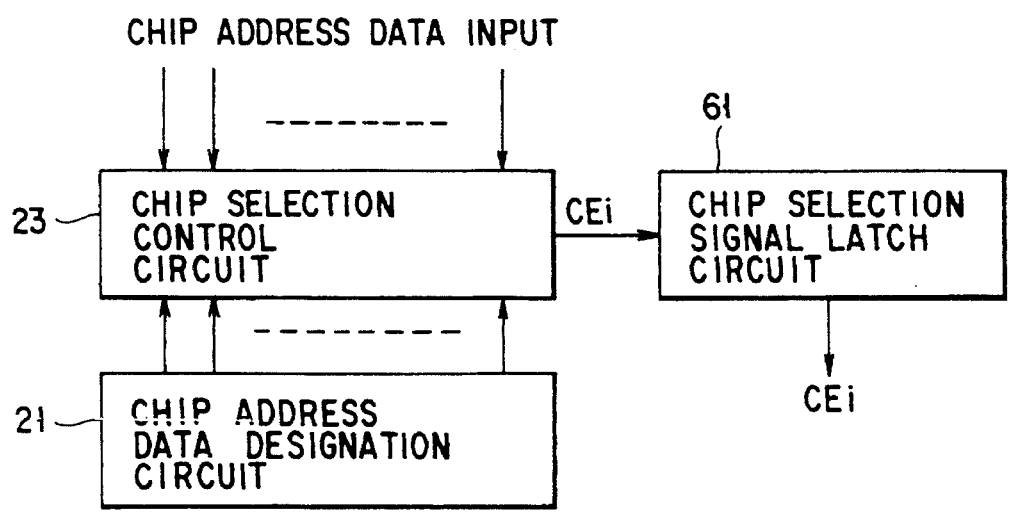
FIG. 6 is a block diagram schematically showing a portion of a mask ROM chip according to a second embodiment of the present invention.
Figure 7:
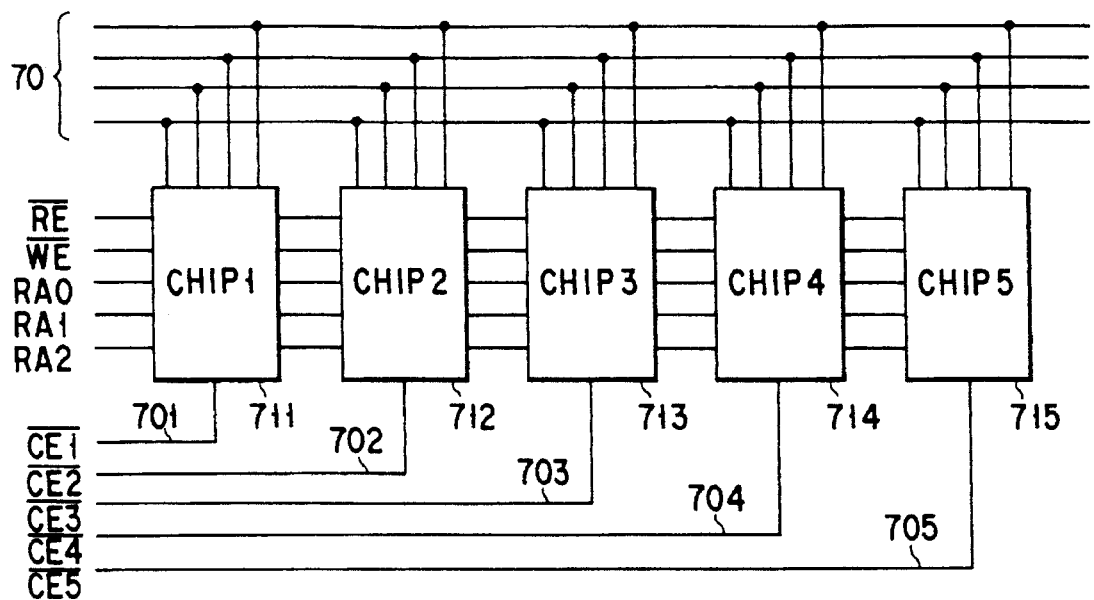
FIG. 7 is a block diagram showing an example of a prior art microcomputer system.
Figure 8:
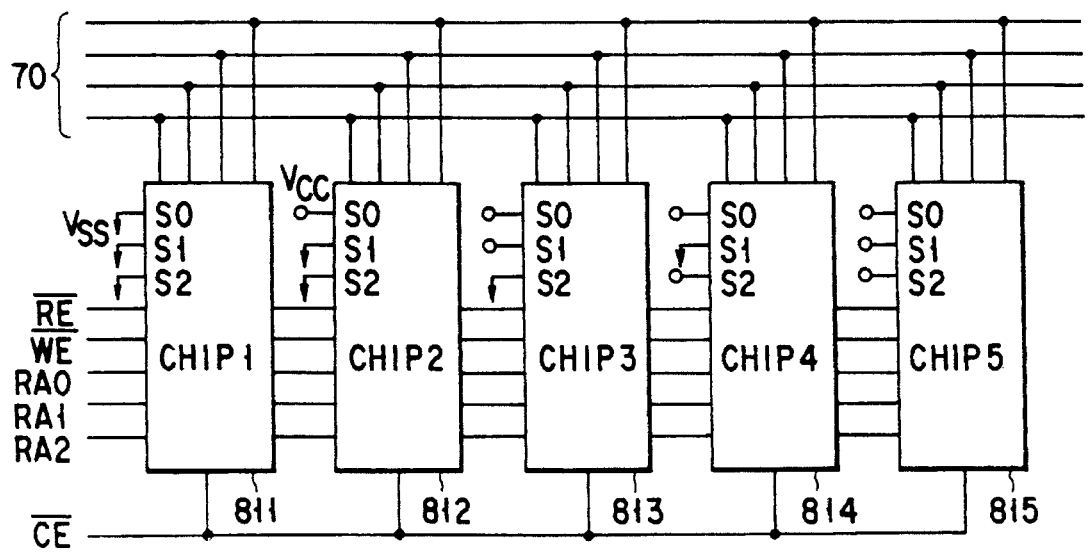
FIG. 8 is a block diagram showing another example of a prior art microcomputer system.

FIG. 6 shows a portion of a mask ROM chip according to a second embodiment of the present invention. The chip of the second embodiment differs from that of the first embodiment in that it does not have a chip address data latch circuit but a chip selection signal latch circuit 61 for latching a chip selection signal CEi output from a chip selection control circuit 23 and that the chip selection control circuit 23 is supplied with chip address data directly from outside the chip. More specifically, the circuit 23 compares the chip address data supplied directly from outside the chip with chip address data output from a chip address data designation circuit 21. When they coincide with each other, a chip selection signal CEi for activating the chip is generated from the circuit 23, and then latched by the circuit 61.

The mask ROM chip of the second embodiment (shown in FIG. 6) requires only one latch circuit (latch selection signal latch circuit 61) for one bit and the number of latch circuits is therefore reduced, as compared with that of the first embodiment which requires the same number of latch circuits (address data latch circuit 22) as that of bits (8 bits) of chip address data.

As described above, the semiconductor integrated circuit according to the present invention needs neither chip selection signal lines the number of which is equal to that of memory chips nor chip address setting terminals for assigning a chip address to its corresponding chip. Since, moreover, chip address data corresponding to a chip address assigned to each of the chips connected to the common buses can be stored nonvolatilely, one of the chips can be selected in response to a chip address supplied from outside the chip.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor integrated circuit comprising:

a chip address data designation circuit having one of nonvolatile circuit characteristic and nonvolatilely programmed wiring corresponding to a chip address assigned to a semiconductor chip, for outputting first chip address data corresponding to the chip address upon receiving an operation power supply voltage;

a chip address data latch circuit for latching second chip address data supplied from outside the semiconductor chip; and a chip selection control circuit for comparing the first chip address data and the second chip address data, and generating a chip selection signal for activating the semiconductor chip when the first chip address data and the second chip address data coincide with each other.

2. A semiconductor integrated circuit comprising:

a chip address data designation circuit having one of nonvolatile circuit characteristic and nonvolatilely programmed wiring corresponding to a chip address assigned to a semiconductor chip, for outputting first chip address data corresponding to the chip address upon receiving an operation power supply voltage;

a chip selection control circuit for comparing the first chip address data with second chip address data supplied from outside the semiconductor chip, and generating a chip selection signal for activating the semiconductor chip when the first chip address data and the second chip address data coincide with each other; and a chip selection signal latch circuit for latching the chip selection signal generated from said chip selection control circuit.

3. The semiconductor integrated circuit according to claim 1, further comprising memory cells each constituted of a MOS transistor in which data is designated by implanting ions into a channel region, and wherein said chip address data designation circuit includes a plurality of flip-flop circuits equal in number to bits of the chip address assigned to the semiconductor chip, each of the flip-flop circuits outputting one of data "1" and data "0" when receiving an operation power supply voltage, and including a MOS load transistor in which a threshold value for designating the data of the memory cells is determined by implanting ions into a channel region in the same process of implanting the ions into the channel regions of the MOS transistors constituting the memory cells.

4. The semiconductor integrated circuit according to claim 2, further comprising memory cells each constituted of a MOS transistor in which data is designated by implanting ions into a channel region, and wherein said chip address data designation circuit includes a plurality of flip-flop circuits equal in number to bits of the chip address assigned to the semiconductor chip, each of the flip-flop circuits outputting one of data "1" and data "0" when receiving an operation power supply voltage, and including a MOS load transistor in which a threshold value for designating the data of the memory cells is determined by implanting ions into a channel region in the same process of implanting the ions into the channel regions of the MOS transistors constituting the memory cells.

5. A semiconductor integrated circuit according to claim 1, wherein said chip address data designation circuit includes a plurality of nodes which are equal in number to bits of the chip address data assigned to the semiconductor chip, and connection wiring formed between each of the nodes and one of a power supply node and a ground node in accordance with the chip address.

6. A semiconductor integrated circuit according to claim 2, wherein said chip address data designation circuit includes a plurality of nodes which are equal in number to bits of the chip address data assigned to the semiconductor chip, and connection wiring formed between each of the nodes and one of a power supply node and a ground node in accordance with the chip address.

* * * * *